US006242362B1

(12) United States Patent
Liu et al.

(10) Patent No.: US 6,242,362 B1
(45) Date of Patent: Jun. 5, 2001

(54) ETCH PROCESS FOR FABRICATING A VERTICAL HARD MASK/CONDUCTIVE PATTERN PROFILE TO IMPROVE T-SHAPED PROFILE FOR A SILICON OXYNITRIDE HARD MASK

(75) Inventors: Jen-Cheng Liu, Chia-Yih; Huan-Just Lin, Hsin-Chu; Chia-Shiung Tsai, Hsin-Chu; Yung-Kuan Hsaio, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/366,736

(22) Filed: Aug. 4, 1999

(51) Int. Cl.[7] ................... H01L 21/302; H01L 21/3065
(52) U.S. Cl. ................... 438/719; 438/706; 438/710; 438/721; 438/197; 438/585; 438/592
(58) Field of Search ................... 148/33.3; 438/197, 438/268, 584, 585, 592, 706, 710

(56) References Cited

U.S. PATENT DOCUMENTS

| 5,139,968 | 8/1992 | Hayase et al. | 437/175 |
|---|---|---|---|
| 5,407,870 | 4/1995 | Okada et al. | 437/241 |
| 5,700,739 | 12/1997 | Chiang et al. | 438/655 |
| 5,731,239 | 3/1998 | Wong et al. | 438/296 |
| 5,766,974 | 6/1998 | Sardella et al. | 437/195 |
| 5,766,993 | 6/1998 | Tseng | 438/253 |
| 5,876,796 | * 3/1999 | Regolini et al. | . |
| 5,930,627 | * 7/1999 | Zhou et al. | . |
| 5,948,703 | * 9/1999 | Shen et al. | . |
| 6,008,139 | * 12/1999 | Pan et al. | . |
| 6,022,776 | * 2/2000 | Lien et al. | . |
| 6,046,103 | * 4/2000 | Thei et al. | . |
| 6,069,086 | * 5/2000 | Nallon et al. | . |
| 6,077,738 | * 6/2000 | Lee et al. | . |
| 6,096,613 | * 8/2000 | Wu | . |

FOREIGN PATENT DOCUMENTS 2 285 336 * 7/1995 (GB) .

* cited by examiner

Primary Examiner—Charles Bowers
Assistant Examiner—Stephen W. Smoot
(74) Attorney, Agent, or Firm—George O. Saile; Stephen B. Ackerma; William J. Stoffe

(57) ABSTRACT

The present invention provides a method of fabricating a vertical hard mask/conductive pattern profile. The process begins by forming a polysilicon or more preferably a polysilicon and silicide conductive layer over a semiconductor substrate. A silicon oxynitride hard mask layer is formed over the conductive layer. The silicon oxynitride hard mask layer is patterned to form a hard mask pattern. The conductive layer is patterned to form a conductive pattern using $Cl_2/He$—$O_2/N_2$ etch chemistry, thereby forming a hard mask/conductive pattern profile that is vertical.

9 Claims, 2 Drawing Sheets

ETCH PROCESS FOR FABRICATING A VERTICAL HARD MASK/CONDUCTIVE PATTERN PROFILE TO IMPROVE T-SHAPED PROFILE FOR A SILICON OXYNITRIDE HARD MASK

BACKGROUND OF THE INVENTION

1) Field of the Invention

This invention relates generally to fabrication of semiconductor devices and more particularly to an etch process for fabricating a vertical hard mask/conductive pattern profile.

2) Description of the Prior Art

In semiconductor fabrication, metal structures are commonly formed by patterning one or more blanket conductive layers. These blanket conductive layers typically have a blanket hard mask layer formed thereover. The hard mask layer protects the underlying conductive layer from damage during etching of higher layers as well as preventing diffusion into and out of the underlying conductive layer. One material that is often used to form a hard mask layer over a polysilicon conductive layer is silicon oxynitride. However, patterning a polysilicon layer and silicon oxynitride hard mask layer using prior art processes can result in a T-shaped hard mask conductive layer profile, reducing the width of the conductive structure thus formed. It is desireable to provide a method of patterning a hard mask and underlying conductive layer which can maintain a more vertical profile.

The importance of overcoming the various deficiencies noted above is evidenced by the extensive technological development directed to the subject, as documented by the relevant patent and technical literature. The closest and apparently more relevant technical developments in the patent literature can be gleaned by considering the following Patents.

U.S. Pat. No. 5,139,968 (Hayase et al.) teaches a method for forming a T-shaped gate electrode.

U.S. Pat. No. 5,407,870 (Okada et al.) discloses a process for forming a SiON layer.

U.S. Pat. No. 5,766,993 (Tseng) discloses a process for forming a poly gate and contact.

U.S. Pat. No. 5,700,739 (Chiang et al.) discloses an oxynitride hard mask and etch process using a reactive ion etch with a fluorine containing ethant.

U.S. Pat. No. 5,731,239 (Wong et al.) shows a silicon oxynitride hard mask and a salicide process.

U.S. Pat. No. 5,766,974 (Sardella) shows an oxynitride layer on an intervener dielectric to provide an etch stop for a $Cl_2$ overetch.

SUMMARY OF THE INVENTION

It is an object of the present invention to provide a method for fabricating a vertical hard mask/conductive pattern profile.

It is another object of the present invention to provide a method for fabricating a vertical silicon oxynitride hard mask/conductive patern profile using a low temperature to deposit the hard mask layer.

To accomplish the above objectives, the present invention provides a method of fabricating a vertical hard mask/conductive pattern profile using a low temperature SiON deposition to form the hard mask layer, and a special $Cl_2/He$—$O_2/N_2$ etch chemistry to etch the SiON hard mask, the conductor (WSix & poly), and the gate oxide.

The process begins by forming a polysilicon or more preferably a polycide conductive layer over a semiconductor substrate. A silicon oxynitride hard mask layer is deposited at low temperature over the conductive layer. The silicon oxynitride hard mask layer is patterned to form a hard mask pattern. The conductive layer is patterned to form a conductive pattern. The silicon oxynitride hard mask releases oxygen during the conductive layer etch. The inventors have found that the oxygen can prevent polymer formation on the sidewalls of the conductive pattern resulting in an undesirable T-shaped hard mask/conductive pattern profile (e.g. the width of the hard mask is greater than the width of the conductive pattern after etching). In the present invention, an etch using $Cl_2/He$—$O_2/N_2$ chemistry prevents undercutting, resulting in a desirable vertical hard mask 1 conductive layer profile.

The present invention provides considerable improvement over the prior art. The key advantage of the present invention is that it prevents the etching process from forming an undercut in the conductive layers underlying the silicon oxynitride hard mask. The inventors believe that nitrogen containing etch chemistry of the present invention prevents undercutting by forming a C-N polymer which deposits on the sidewalls of the conductive layer (polysilicon and/or tungsten silicide) protecting the conductive layers from overetching.

Another important advantage of the invention is the deposition temperature for the silicon oxynitride hard mask. Silicon oxynitride can be deposited at about 400° C., using a chemical vapor deposition process. Conventional furnace silicon nitride deposition requires a temperature of about 800° C. The invention's lower temperature for SiON is important in high speed DRAM devices because the conventional high temperature for silicon nitride deposition can adversely effect sheet resistance for the titanium silicide source/drain contacts used in such devices.

The present invention achieves these benefits in the context of known process technology. However, a further understanding of the nature and advantages of the present invention may be realized by reference to the latter portions of the specification and to attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides an etching process for fabricating a T-shaped hard mask/conductive pattern profile to improve the self-aligned contact isolation.

Substrate, as used in the following description means a silicon substrate suitable for use in manufacturing an integrated circuit. The substrate may have already undergone one or more processing steps, including any steps previously described herein.

Conductive pattern, as used in the following description means a conductive part of a device such as a gate electrode or a bit line.

Figure 1:
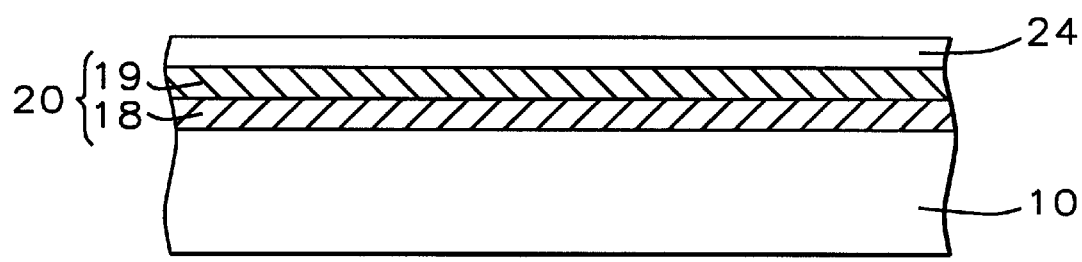
FIGS. 1, 2 & 3 illustrate sequential cross-sectional views of the present invention's process for forming a vertical hard mask/conductive pattern profile.

Referring to FIG. 1, the process begins by providing a substrate (10) having a conductive layer (20) thereon. Additional layers and or devices can be on the substrate under the conductive layer (20), such as a gate silicon oxide or gate dielectric layer (not shown). The conductive layer (20) preferably consists of a tungsten silicide layer (19) having a thickness of between about 500 Angstroms and 3000 Angstroms on a conductively doped polysilicon layer (18) having a thickness of between about 500 Angstroms and 3000 Angstroms. The conductive layer (20) and the underlying layers and devices are formed using methods known in the art.

Still referring to FIG. 1, a hard mask layer (24) is formed on the conductive layer (20). The hard mask is composed of Silicon Oxynitride (SiON).

A key advantage of the present invention is that the SiON hard mask can be formed at a temperature of between about 375° C. and 450° C. The hard mask is preferably formed by a chemical vapor deposition process. High temperatures (approximately 800° C.) can adversely effect the sheet resistance of silicide contacts. The low deposition temperature used for the SiON hard mask formation does not adversely effect sheet resistance of the silicide contact in high speed applications. This is especially true in an embedded (logic & memory) DRAM process, where a silicide (e.g. TiSi,) is used to decrease sheet resistance (for high speed) in logic. If the silicide is subjected to a high temperature SiN (SiON) deposition, the sheet resistance is hard to control.

Figure 2:
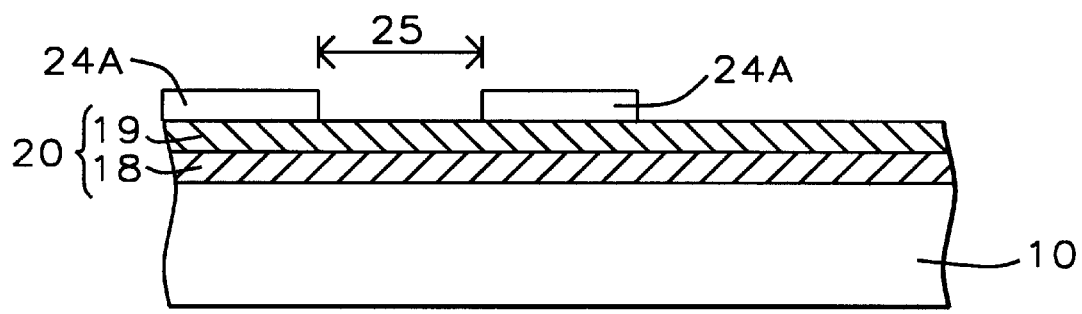

Referring to FIG. 2, the hard mask layer (24) is patterned, using photolithography and etching methods as are known in the art, to form a hard mask pattern (24A). The hard mask pattern has a hard mask pattern width (25) of between about 1000 Angstroms and 3000 Angstroms.

Figure 3:
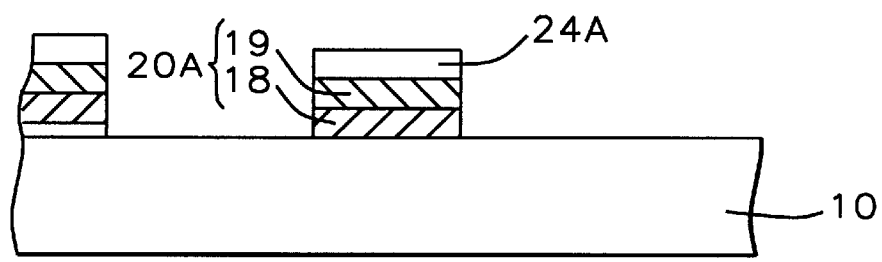

In a key step, as shown in FIG. 3, the conductive layer (20) and gate dielctric layer are etched to form a conductive pattern (20A) using a $Cl_2/He—O_2/N_2$ chemistry. The etch is performed using a $Cl_2$ to $He—O_2$ flow rate ratio of between about 30 and 60 (where the $He—O_2$ mixture is between 80% helium and 85% helium by volume and a $Cl_2$ to $N_2$ flow rate ratio of between about 20 and 40. The etch is performed at a pressure of between about 2 mTorr and 10 mTorr and a top electrode power of between about 200 W and 300 W. For example, the following etch recipe can be used.

4mt/250TCP/200Bot/90$Cl_2$/2-He-O2/3$N_2$

The etch is performed at a pressure of between about 2 mTorr and 6 mTorr, referably about 4 mTorr. The top electrode power is between about 225 Watts and 275 Watts, preferably 250 Watts. The bottom electrode power is between about 175 Watts and 225 Watts, preferably 200 Watts. The $Cl_2$ flow rate is between about 80 sccm and 100 sccm, preferably about 90 sccm. The $He—O_2$ flow rate is between about 1 sccm and 3 sccm, preferably about 2 sccm. The $N_2$ flow rate is between about 2 sccm and 4 sccm, preferably about 3 sccm. The flow rates should be understood to be scaled up or down depending on chamber size provided the ratios are maintained.

A key advantage of the invention is that the conductive layer (20) is etched such that the nitrogen containing etchant provides a vertical hard mask/conductive pattern sidewall profile. The inventors believe that nitrogen containing etch chemistry of the present invention prevents undercutting by forming a C-N polymer which deposits on the sidewalls of the conductive layer (polysilicon and/or tungsten silicide) protecting the conductive layers from overetching.

Figure 4:
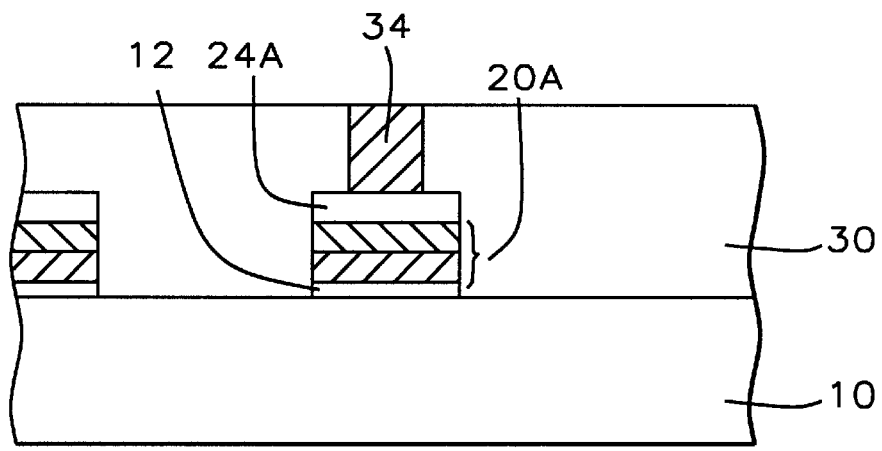
FIG. 4 illustrates a cross-sectional view of a semiconductor device using the process of the present invention to provide a vertical hard mask/conductive pattern sidewall profile.

Referring to FIG. 4, a dielectric layer (30) is formed over the hard mask (24A). A contact plug (34) can be formed to connect the conductive pattern (20A) to subsequently formed interconnections. FIG. 4 also shows a gate dielectric layer (12) (e.g. gate oxide). Conventional processes can be used to form FET devices (source/drain, spacers, etc.) and overlying metal and insulating layers for memory and logic devices.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a vertical hard mask/conductive pattern profile comprising the steps of:
    a) providing a substrate having a conductive layer there over; said conductive layer comprising polysilicon;
    b) forming a hard mask layer on said conductive layer; said hard mask layer being composed of silicon oxynitride;
    c) patterning said hard mask layer to form a hard mask pattern; and
    d) etching said conductive layer using $Cl_2$, a $He—O_2$ mixture, and $N_2$ to form a conductive pattern wherein the $Cl_2$ to $He—O_2$ mixture flow rate ratio is between about 30 and 60, the $Cl_2$ to $N_2$ flow rate ratio is between about 20 and 40, and the $He—O_2$ mixture is between 80% He and 85% He by volume.

2. The method of claim 1 wherein said conductive layer is etched at a pressure of between about 2 mTorr and 10 mTorr.

3. The method of claim 1 wherein said conductive layer is etched at a pressure of between about 2 mTorr and 6 mTorr; a top electrode power of between about 225 Watts and 275 Watts; a bottom electrode power of between about 175 Watts and 225 Watts; a $Cl_2$ flow rate of between about 80 sccm and 100 sccm; a $He—O_2$ mixture flow rate of between about 1 sccm and 3 sccm; and a $N_2$ flow rate of between about 2 sccm and 4 sccm.

4. The method of claim 1 wherein the conductive pattern is a gate electrode comprising a gate oxide layer, a tungsten silicide layer, and a doped polysilicon layer.

5. The method of claim 1 wherein the conductive pattern is a bit line.

6. A method for fabricating a vertical hard mask/conductive pattern profile comprising the steps of:
    a) providing a substrate having there over a gate dielectric layer and a conductive layer; said conductive layer comprising a Tungsten Silicide layer overlying a Polysilicon layer;
    b) forming a hard mask layer on said conductive layer; said hard mask layer comprising silicon oxynitride;
    c) patterning said hard mask layer to form a hard mask pattern; and
    d) etching said conductive layer using $Cl_2$, $He—O_2$, and $N_2$ with a $Cl_2$ to $He—O_2$ flow rate ratio of between about 30 and 60 wherein the $He—O_2$ mixture is between 80% He and 85% He by volume, a $Cl_2$ to $N_2$ flow rate ratio of between about 20 and 40, and at a pressure of between about 2 mTorr and 10 mTorr; thereby forming a hard mask/conductive pattern profile that is vertical.

7. The method of claim 6 wherein said conductive layer is etched at a pressure of between about 2 mTorr and 6 mTorr; a top electrode power of between about 225 Watts and 275 Watts; a bottom electrode power of between about 175 Watts and 225 Watts; a $Cl_2$ flow rate of between about 80 sccm and 100 sccm; a He—$O_2$ flow rate of between about 1 sccm and 3 sccm; and a $N_2$ flow rate of between about 2 sccm and 4 sccm.

8. The method of claim 6 wherein said conductive pattern is a bit line.

9. The method of claim 6 wherein said conductive pattern is a gate electrode in an embedded DRAM with titanium silicide contacts.

* * * * *

UNITED STATES PATENT AND TRADEMARK OFFICE
CERTIFICATE OF CORRECTION

PATENT NO. : 6,242,362 B1
DATED : June 5, 2001
INVENTOR(S) : Jen-Cheng Liu, Huan-Just Lin, Chia-Shiung Tsai, Yung-Kuan Hsaio It is certified that error appears in the above-identified patent and that said Letters Patent is hereby corrected as shown below:

<u>Title page,</u>
Item [74], please correct the second agent's name to read -- Stephen B. Ackerman -- and the third agent's name to read -- William J. Stoffel --.

Signed and Sealed this

Twenty-sixth Day of March, 2002

*Attest:*

*Attesting Officer*

JAMES E. ROGAN
*Director of the United States Patent and Trademark Office*